(12) United States Patent
Thomas

(10) Patent No.: US 6,448,103 B1
(45) Date of Patent: Sep. 10, 2002

(54) METHOD FOR MAKING AN ACCURATE MINIATURE SEMICONDUCTOR RESONATOR

(75) Inventor: Danielle A. Thomas, Dallas, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 09/870,259

(22) Filed: May 30, 2001

(51) Int. Cl.[7] .............................................. H01L 21/00
(52) U.S. Cl. .............................. 438/52; 438/50; 438/51; 438/53; 438/54
(58) Field of Search ............................ 438/700, 50, 51, 438/52, 53, 54, 55

(56) References Cited

U.S. PATENT DOCUMENTS

| | | | |
|---|---|---|---|
| 5,090,254 A | | 2/1992 | Guckel et al. ............ 73/862.59 |
| 5,429,993 A | * | 7/1995 | Beitman et al. ............... 438/52 |
| 5,543,349 A | * | 8/1996 | Kurtz ........................... 438/51 |
| 5,721,162 A | * | 2/1998 | Schubert ....................... 438/52 |
| 5,917,226 A | | 6/1999 | Chan et al. ................. 257/415 |
| 5,963,788 A | * | 10/1999 | Barron .......................... 438/48 |
| 6,021,675 A | | 2/2000 | Seefeldt et al. ............... 73/777 |
| 6,028,343 A | | 2/2000 | Chan et al. .................. 257/417 |
| 6,040,611 A | * | 3/2000 | De Los Santos ............ 257/415 |
| 6,054,745 A | * | 4/2000 | Nakos ........................ 257/415 |
| 6,058,778 A | | 5/2000 | Chan et al. .............. 73/514.16 |
| 6,118,164 A | | 9/2000 | Seefeldt et al. ............. 257/417 |
| 6,124,765 A | | 9/2000 | Chan et al. .................. 331/116 |
| 6,171,879 B1 | | 1/2001 | Chan et al. ................... 438/52 |
| 6,218,209 B1 | | 4/2001 | Chan et al. ................... 438/52 |

* cited by examiner

Primary Examiner—David Nelms
Assistant Examiner—Thao P Le
(74) Attorney, Agent, or Firm—Lisa K. Jorgenson; Peter J. Thoma

(57) ABSTRACT

A cantilevered beam is formed over a cavity to an accurate length by isotropically etching a fast-etching material, such as hydrogen silisquioxane, out of the cavity. The cavity is initially defined within a slow-etching material. The selectivity of the etch rates of the material within the cavity relative to the material defining the walls of the cavity permits accurate control of the length of the free end of the cantilevered beam. The resonant frequency of the cantilevered beam can be tuned to a narrow predetermined range by laser trimming.

10 Claims, 2 Drawing Sheets

METHOD FOR MAKING AN ACCURATE MINIATURE SEMICONDUCTOR RESONATOR

BACKGROUND OF THE INVENTION

The present invention relates generally to methods for making semiconductor transducers, and more particularly to the micromachining of a semiconductor resonator.

Sophisticated integrated circuit devices require internal timing circuits for proper operation and synchronized communication with other devices and systems. A common timing technique is the use of an oscillator circuit that responds to an external dedicated piezoelectric crystal, which is typically quartz. By cutting the quartz crystal to precise dimensions, it can be stimulated to oscillate at a precise natural resonant frequency. The resulting oscillations can be input to an oscillator circuit on board an integrated circuit chip. The IC chip can then perform its functions at a precise operating frequency. Though such quartz crystal resonators are very accurate, they are manufactured separately from the IC chip fabrication, and require assembly with the chip at a later manufacturing stage.

SUMMARY OF THE INVENTION

The present invention enables integration of a miniature resonator with an integrated circuit chip as part of the same semiconductor fabrication process. A beam of conductive material is formed over a cavity and supported at one end. The length and mass of the beam are accurately controlled during fabrication so that its natural resonant frequency can be maintained to a high tolerance. This natural frequency can be used to drive an on-chip oscillator circuit and associated timing circuits to permit accurate synchronous operation and external communication.

In its most preferred technique, a polysilicon beam is patterned to lie over laterally adjacent materials having highly differentiated etch rates. The fast-etching material is removed from beneath the beam using isotropic etching. The beam is left cantilevered over a cavity supported at one end by the slow-etching material. The beam is then trimmed using a laser to reduce its mass in a controlled manner, thereby precisely tuning the beam to a natural resonant frequency within a narrow predetermined range.

DETAILED DESCRIPTION OF THE INVENTION

Figure 1:
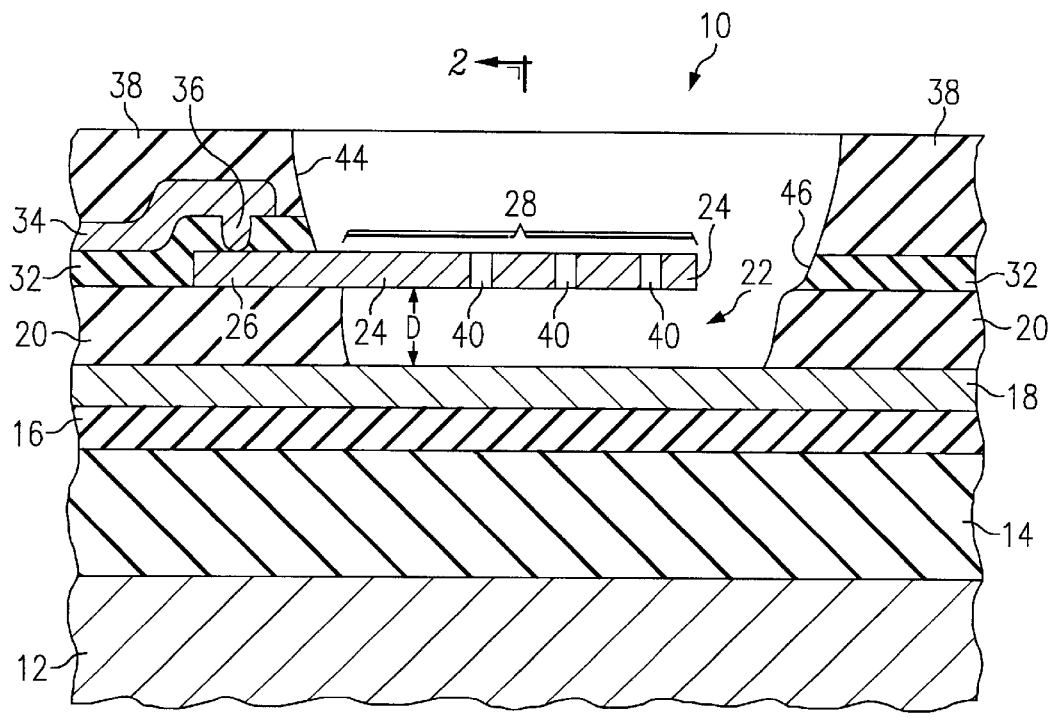
FIG. 1 is a schematic vertical cross section taken through the longitudinal center-line of a cantilevered beam made in accordance with the inventive method.
Figure 2:
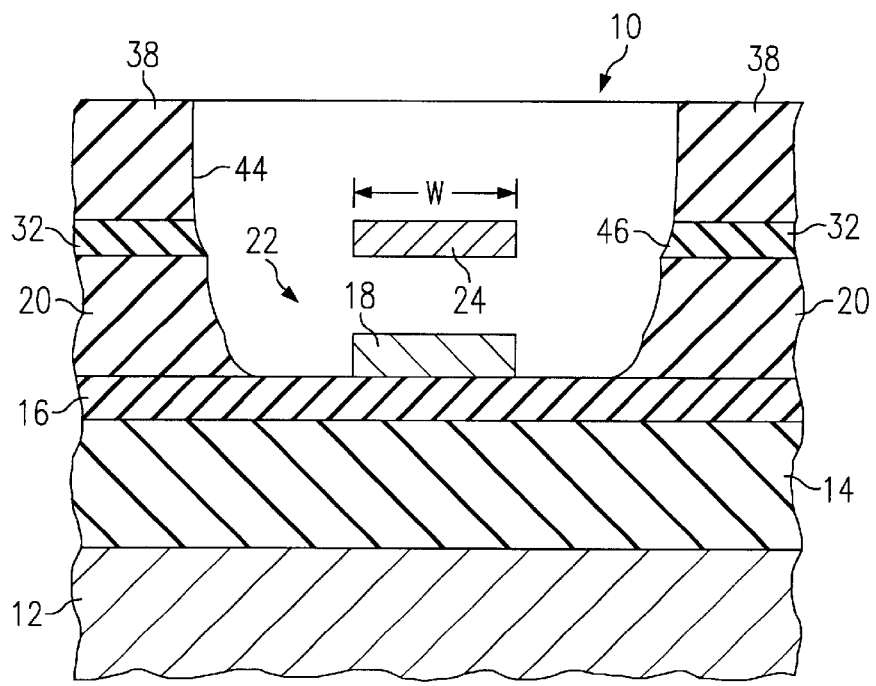
FIG. 2 is a schematic vertical cross-section taken through a plane perpendicular to the longitudinal center-line of the beam at an intermediate point along its length, such as along line 2—2 of FIG. 1.

With reference to FIGS. 1 and 2, a portion of an integrated circuit device is illustrated and designated generally by reference numeral 10. The device 10 is formed on a semiconductor substrate 12, which may include an upper epitaxial layer grown on a lower substrate portion (not shown). During fabrication, multiple square or rectangular chips are formed together on large circular wafer (not shown). After fabrication, the chips are separated from the wafer and packaged as separate IC devices. The following description of a preferred embodiment of the invention applies to each of the multiple chips on the wafer.

At locations of the chip that are not shown in the figures, functional circuits are formed, including an oscillator circuit for generating timing signals to synchronize device operations. These functional circuits are defined by transistors formed within active areas (not shown). The active areas are isolated from each other by a thick insulating layer, commonly known as a field oxide layer, a portion of which is shown in the figures and designated by reference number 14.

A dielectric layer 16, which preferably comprises silicon nitride, overlies the field oxide layer 14. A conductor 18 overlies the silicon nitride layer 16. The conductor 18 is preferably heavily-doped polysilicon that has been patterned to form an elongated strip having a width W of a few microns. Above the conductor 18 is a dielectric layer 20, which preferably is a relatively dense deposited oxide. A generally rectangular cavity 22 is formed in the oxide layer 20 above a portion of conductor 18 and along its sides down to the nitride layer. 16. A cantilevered beam 24 extends laterally part way out over the cavity 22. As shown in FIG. 2, the beam 24 preferably has the same width W as the underlying conductor 18. The beam 24 has a fixed end 26 supported at one side of the cavity 22 by a portion of oxide layer 20, as shown in FIG. 1. The beam 24 has an elongated free end 28 that extends out over the cavity 22 by about 15 to 20 microns.

A doped oxide layer 32, such as borophosphosilicate glass (BPSG), overlies oxide layer 20 and the fixed end 26 of the beam 24. Other suitable materials can be used for the layer 32. A metal conductor 34 is formed on the BPSG layer 32, which includes an opening extending therethrough to allow a metal contact 36, which is a portion of the conductor 34, to come into contact with the fixed end 26 of the beam 24. As is common practice in present semiconductor fabrication processes, conductor 34 is preferably a composite of several metal layers, which are not separately shown. An upper dielectric layer 38 is formed over the conductor 34 and the BPSG layer 32, leaving the free end 28 of the beam 24 exposed.

When stimulated, the beam 24 will resonate at a predetermined frequency that depends on its mass and dimensions. The resonant frequency can be tuned to bring it into a narrow precise range by trimming away portions of the beam 24 to alter its mass. Preferably, the trimming operation is performed by drilling holes 40 through the beam 24 using a laser.

In operation, the beam 24 is caused to oscillate at its natural resonant frequency after applying a stimulus. For example, a short voltage pulse can be applied through the conductor 34 to the beam 24 to make it positive by several volts relative to the underlying conductor 18. The beam 24 is attracted downward toward the underlying conductor 18 when the voltage differential is present. When the voltage pulse is removed, the beam flexes back toward its unbiased position and overshoots that position. This initial action is much like the action of a diving board after a diver leaps off into a swimming pool. However, because the beam 24 is extremely small, its movements in response to the voltage pulse will be very small and very rapid. After applying and removing the voltage pulse, the beam 24 will continue to oscillate at a very high constant frequency for a duration measured in minutes. Once the beam's oscillations have attenuated to about half its initial amplitude, a further stimulating pulse can be applied. Thus, the beam 24 can be maintained in an oscillating state indefinitely.

It will be recognized that the beam 24 and underlying conductor 18 define a capacitor in which the plates are separated by a very small distance D, which preferably is about 2000 Angstroms. Thus, the oscillations of the beam 24 cause corresponding oscillations in the value of the capacitance of the capacitor. These changes in capacitance can be sensed electrically and amplified to drive an oscillator circuit (not shown) formed nearby on the common substrate 12. As an alternative to applying successive stimulating pulses, a feedback circuit can be used to maintain the beam 24 in its oscillating state at a constant amplitude after applying a single initial pulse.

Figure 3:
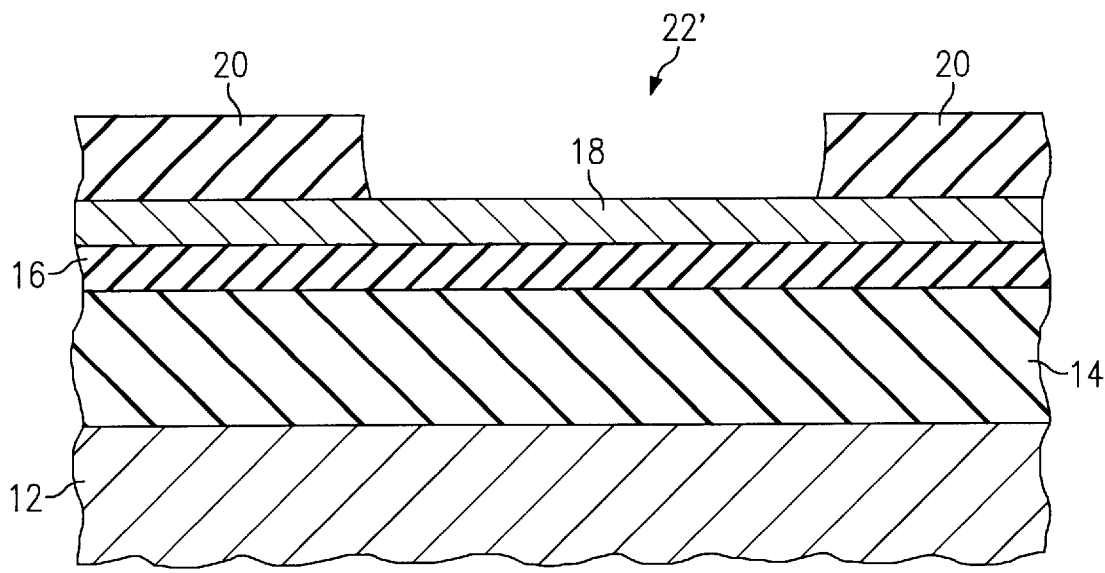
FIGS. 3 and 4 are schematic vertical cross sections taken along the same plane as in FIG. 1 but at earlier stages in the fabrication process to illustrate features of the inventive method.
Figure 4:
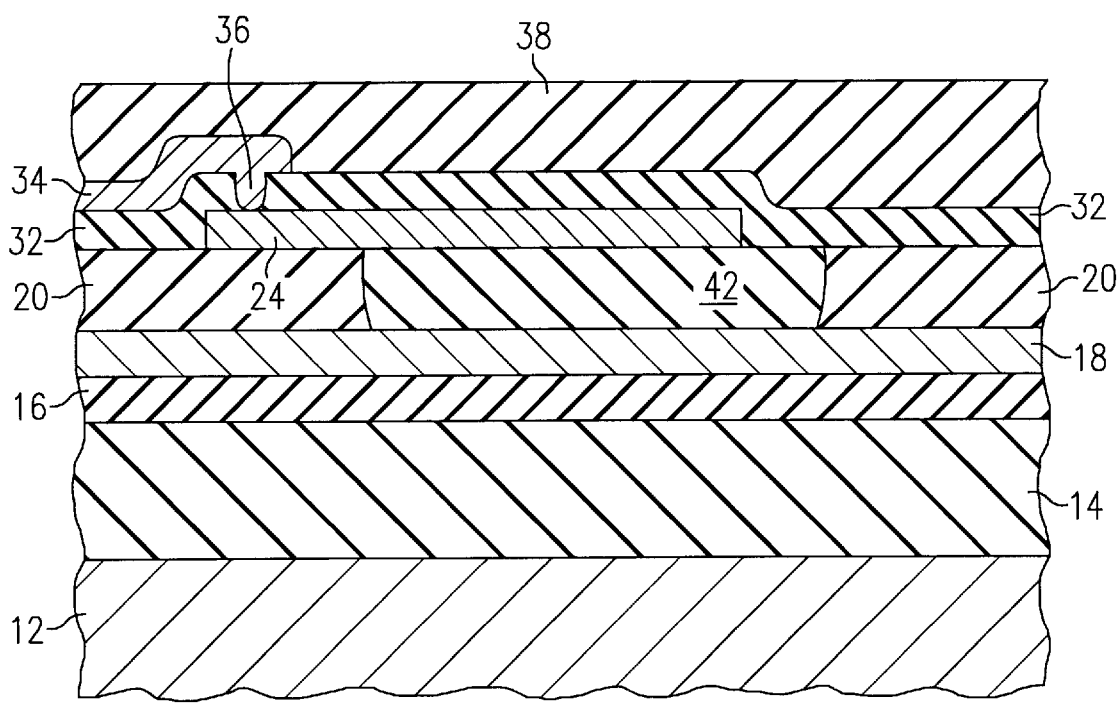

Referring to FIGS. 3 and 4, a preferred method for making the above-described structure will now be described. With particular reference to FIG. 3, the thick field oxide layer 14 is preferably formed by growing oxide on selected portions of the substrate 12. Oxide growth is inhibited in the active areas of the substrate by a nitride layer (not shown) that has been patterned using conventional photolithographic techniques. Although the beam resonator of the present invention is shown as being formed entirely over the field oxide layer 14, it may alternatively overlie active area portions of the underlying substrate.

A thin silicon nitride layer 16 is deposited by chemical vapor deposition (CVD) on the field oxide layer 14. Then, a doped polysilicon layer is deposited by CVD on the nitride layer 16. The polysilicon layer is photolithographically patterned to define the conductor 18. Next, a dense oxide layer 20 is deposited by CVD over the device. A photoresist mask (not shown) is patterned on the oxide layer 20 leaving a window through which a temporary cavity 22' is formed by etching. The cavity 22' extends down to the polysilicon conductor 18 and along its sides down to the nitride layer 16 (similar to the way the final permanent cavity 22 appears in FIG. 2). Following the etching, the photoresist mask is removed to arrive at the structure of FIG. 3.

Referring to FIG. 4, the temporary cavity 22' is filled with a fast-etching material 42, such as hydrogen silisquioxane (HSQ), or other suitable insulating material that etches at a rate that is at least ten times faster than the etch rate of the oxide layer 20. Then, a second doped polysilicon layer is deposited on the device and patterned using conventional photolithographic techniques to provide the beam 24, which partially overlies the oxide layer 20 and partially overlies the HSQ material 42. Then, BPSG layer 32 is deposited over the device and an opening is cut down through to the conductor 24 to permit subsequent formation of the metal contact 36 in the opening. The contact formation occurs upon deposition of the metal layers that are patterned and together define the conductor 34. Next, the upper dielectric layer 38 is deposited on the device to arrive at the structure shown in FIG. 4.

Referring again to FIGS. 1 and 2, a first opening 44 is cut through the upper dielectric layer 38 by etching using a photoresist pattern (not shown). The etching is continued to provide a second opening 46 in the BPSG layer 32 aligned beneath the first opening 44. Then, the holes 40 are drilled through the beam 24. This is done using an automated laser stepper that sequentially drills several holes in the beam 24 and repeats the drilling process through other beams (not shown) of other IC chips on the same wafer. The number of holes 40 in each beam of the various IC chips are identical and are determined by testing performed during phototype runs. For production runs, therefore, the laser drilling operation can be programmed to be repeated in an identical way for each beam on each run.

Finally, the wafer is exposed to an isotropic etch, which preferably is done in a bath of buffered hydrofluoric (HF) acid. The HF acid etches HSQ twenty to thirty times faster than it etches the dense deposited oxide 20. Thus, the HSQ material 42 (FIG. 4) is completely etched away very rapidly. The oxide layer 20 is exposed to the HF acid for a short time relative to its etch rate so that very little of the oxide layer 20 is removed at this stage. Therefore, the dimensions of the final permanent cavity 22 (FIGS. 1 and 2) in the oxide layer 20 are not significantly wider than the dimensions of the original temporary cavity 22' (FIG. 3). The high degree of selectivity of the etch rates, HSQ being much faster than oxide, enables the length of the free end 28 of the beam 24 to be controlled to a precise degree. By trimming the mass of the beam 24 using laser drilling as described above, a beam with a highly accurate resonant frequency can be fabricated. The resulting IC device can base its timing circuitry on this frequency to obtain reliable synchronous operation without resort to a separate quartz crystal resonator.

Although the preferred embodiment has been described in detail, it should be understood that various changes, substitutions and alterations can be made therein without departing from the spirit and scope of the invention as defined by the appended claims.

What is claimed is:

1. A method for making a semiconductor resonator, comprising:

providing a semiconductor substrate;

forming a first dielectric layer supported above the substrate;

forming a first conductor on the first dielectric layer;

depositing a second dielectric layer over the first conductor;

opening a temporary cavity in the second dielectric layer over the first conductor;

filling the temporary cavity with an insulating material, the insulating material being characterized by an etch rate that is at least ten times faster than the etch rate of the second dielectric layer;

forming a second conductor partially on the second dielectric layer and partially on the insulating material; and isotropically etching the insulating material and the second dielectric layer with an acid that etches the insulating material at a rate that is at least ten times faster than the rate that the acid etches the second dielectric layer, the etching being continued until the insulating material is entirely removed from beneath the second conductor creating a permanent cavity defined within the second dielectric layer;

whereby the second conductor has an elongated free end that cantilevers from the second dielectric layer over the permanent cavity by an accurate length dimension.

2. The method of claim 1 wherein the insulating material comprises hydrogen silisquioxane.

3. The method of claim 2 wherein the second dielectric layer comprises a dense deposited oxide.

4. The method of claim 2 wherein the first and second conductors comprise doped polysilicon.

5. The method of claim 1 further comprising the step of laser drilling at least one hole through the cantilevered free end of the second conductor to reduce its mass, whereby its resonant frequency is trimmed to be within a predetermined frequency range.

6. A method for making a semiconductor resonator, comprising:

forming a thin layer of a first material above a semiconductor substrate;

etching a temporary cavity through the thin layer;

filling the temporary cavity with a second material that has an etch rate that is at least twenty times faster than the etch rate of the first material;

forming an elongated conductive beam lying partially on the thin layer and partially on the second material; and removing the second material by etching with an acid that etches the second material at least twenty times faster than it etches the first material to form a permanent cavity under a portion of the conductive beam;

whereby the beam has a portion supported by the thin layer of first material and a portion cantilevering out over the permanent cavity by a predetermined length.

7. The method of claim 6 wherein the second material comprises hydrogen silisquioxane.

8. The method of claim 7 wherein the first material comprises a dense deposited oxide.

9. The method of claim 7 wherein the elongated conductive beam comprises doped polysilicon.

10. The method of claim 6 further comprising the step of laser drilling at least one hole through the cantilevered portion of the beam to reduce its mass, whereby its resonant frequency is trimmed to be within a predetermined frequency range.

* * * * *